United States Patent
Dorn et al.

(10) Patent No.: US 9,103,026 B1
(45) Date of Patent: Aug. 11, 2015

(54) FILTER CIRCUIT FOR A MAGNETRON DEPOSITION SOURCE

(75) Inventors: Randy Dorn, San Jose, CA (US); Jason Cheng, Cupertino, CA (US); Hyung Paek, San Mateo, CA (US)

(73) Assignee: APOLLO PRECISION BEIJING LIMITED, Beijing (CN)

( * ) Notice: Subject to any disclaimer, the term of this patent is extended or adjusted under 35 U.S.C. 154(b) by 808 days.

(21) Appl. No.: 13/277,441

(22) Filed: Oct. 20, 2011

Related U.S. Application Data

(60) Provisional application No. 61/405,208, filed on Oct. 21, 2010.

(51) Int. Cl.
 *C23C 14/34* (2006.01)
 *C23C 14/35* (2006.01)
 *H01J 37/34* (2006.01)

(52) U.S. Cl.
 CPC ............. *C23C 14/35* (2013.01); *H01J 37/3458* (2013.01)

(58) Field of Classification Search
 CPC ..... C23C 14/35; H01J 37/345; H01J 37/3458
 USPC ............... 204/298.08, 298.16, 298.2, 192.12; 361/143, 146, 152, 156, 159; 335/156
 See application file for complete search history.

(56) References Cited

U.S. PATENT DOCUMENTS

| | | | |
|---|---|---|---|
| 5,184,045 A | 2/1993 | Im | |
| 5,471,360 A * | 11/1995 | Ishikawa et al. | 361/154 |
| 5,569,363 A * | 10/1996 | Bayer et al. | 204/192.32 |
| 6,971,391 B1 | 12/2005 | Wang et al. | |
| 7,244,344 B2 * | 7/2007 | Brown et al. | 204/298.11 |
| 7,345,428 B2 * | 3/2008 | Turner | 315/111.21 |
| 7,837,838 B2 * | 11/2010 | Chua et al. | 204/192.22 |
| 2007/0029188 A1 | 2/2007 | Gorokhovsky | |
| 2007/0034509 A1 * | 2/2007 | Chen | 204/298.16 |
| 2009/0114244 A1 * | 5/2009 | Sexton et al. | 134/1.1 |
| 2009/0260976 A1 | 10/2009 | Nakamura | |
| 2010/0187093 A1 | 7/2010 | Kuribayashi | |

FOREIGN PATENT DOCUMENTS

JP 06029119 A * 2/1994

* cited by examiner

*Primary Examiner* — John Brayton
(74) *Attorney, Agent, or Firm* — The Marbury Law Group PLLC

(57) ABSTRACT

A magnetron sputtering system comprising a vacuum processing chamber having a chamber shield, a magnetron assembly, and a substrate, the magnetron assembly comprising a permanent magnetic assembly and an electromagnetic coil assembly, a first impedance circuit coupled between a power supply and the electromagnetic coil assembly, the first impedance circuit comprising a first resistor and a first capacitor, and a second impedance circuit having a second resistor and a second capacitor, and coupled between the substrate and a susceptor.

26 Claims, 3 Drawing Sheets

FILTER CIRCUIT FOR A MAGNETRON DEPOSITION SOURCE

CROSS REFERENCE TO RELATED PATENT APPLICATION

This application claims the benefit of U.S. Provisional Application No. 61/405,208 filed Oct. 21, 2010, incorporated herein by reference in its entirety.

FIELD OF THE INVENTION

The present invention relates generally to an apparatus for depositing thin films in a magnetron sputtering system. More particularly the invention relates to a magnetron sputter deposition source comprising a system of permanent magnets in series with electromagnetic coils and further comprising a power source for magnetron sputter deposition, a sweeping power supply for the electromagnetic coils, and a filtering circuit in parallel with the electromagnetic coils.

BACKGROUND OF THE INVENTION

Sputtering is a well-known technique for depositing uniform thin films on a particular substrate. Sputtering is performed in an evacuated chamber using an inert gas, typically argon, with one or more substrates being transported past the target. An exemplary sputtering technique is magnetron sputtering which utilizes magnetrons. Examples of such magnetron sputtering techniques, such as planar magnetron sputtering and rotary magnetron sputtering are discussed in U.S. Pat. No. 7,544,884, issued on Jun. 9, 2009, and which is hereby incorporated by reference in its entirety.

Typically, evacuation of the sputtering chamber is a two-stage process in order to avoid contaminant-circulating turbulence in the chamber. First, a throttled roughing stage slowly pumps down the chamber to a first pressure, such as about 50 mtorr. Then, high vacuum pumping occurs using turbo or diffusion pumps to evacuate the chamber to the highly evacuated base pressure (about 10E-6 Torr) necessary to perform sputtering. Sputtering gas is subsequently provided in the evacuated chamber, backfilling to a pressure of about 2-10 mtorr.

The sputtering process is useful for depositing coatings from a plurality of target materials onto a various substrate materials including glass, stainless steel, plastics, and ceramic materials. However, the relatively low sputtering rate achieved by the process solely relying on electrostatic forces (diode sputtering) may be impracticable for certain commercial applications where high volume processing is desired. Consequently, various magnet arrangements have been used to enhance the sputtering rate by trapping electrons close to the target surface, ionizing more argon, increasing the probability of impacting and dislodging target atoms and therefore the sputtering rate. In particular, an increased sputtering rate is achieved by manipulation of a magnetic field geometry in the region adjacent to the target surface. Sputter deposition performed in this manner is generally referred to as magnetron sputtering.

The role of the magnetic field is to trap moving electrons near the target. The field generates a force on the electrons, inducing the electrons to take a spiral path about the magnetic field lines. Such a spiral path is longer than a path along the field lines, thereby increasing the chance of the electron ionizing a plasma gas atom, typically argon. In addition, field lines also reduce electron repulsion away from a negatively biased target. As a result, a greater ion flux is created in the plasma region adjacent to the target with a correspondingly enhanced erosion of target atoms from an area which conforms to a shape approximating the inverse shape of the field lines. Thus, if the field above the target is configured in arcuate lines, the erosion region adjacent to the field lines conforms to a shallow track, leaving much of the target unavailable for sputtering.

To overcome the low utilization of sputtering targets the application of electromagnetic coils in combination with permanent magnets has been used to sweep the magnetic field across the surface of the target using an adjustable power supply connected to the electromagnetic coils, which thereby increases the region of erosion on the target surface and the overall utilization of target material.

However, in magnetron sputtering systems that rely on power supplies with high frequency pulsed power signals the inventors have discovered an unwanted coupling between the magnetron power supplies and the electromagnetic coil power supplies, resulting in greatly reduce reliability and an increased rate of failure in the switching systems that control the polarity of current delivered to the electromagnetic coils.

SUMMARY OF THE INVENTION

One embodiment of this invention provides an RC filter comprising a capacitor in parallel with a resistor, each of which is in series with an electromagnetic coil and wherein the electromagnetic coil is combined with a system of permanent magnets inside a magnetron sputter deposition source, and further wherein the magnetron sputter source is powered by one or more high-frequency pulsed power supplies such as pulsed-DC, AC, or RF. Pulsed-DC power supplies may be pulsed at frequencies ranging from 20 kHz up to 400 kHz in some embodiments.

DESCRIPTION OF THE PREFERRED EMBODIMENTS

One embodiment of the present invention provides an RC filter comprising a capacitor in parallel with a resistor, wherein the capacitor and resistor are connected to ground at both ends of an electromagnetic coil, and wherein the electromagnetic coil is combined with a system of permanent magnets inside a magnetron sputter deposition source. In some embodiments, the magnetron sputter deposition source is powered by pulsed-DC, AC, or RF power supplies.

Figure 3:
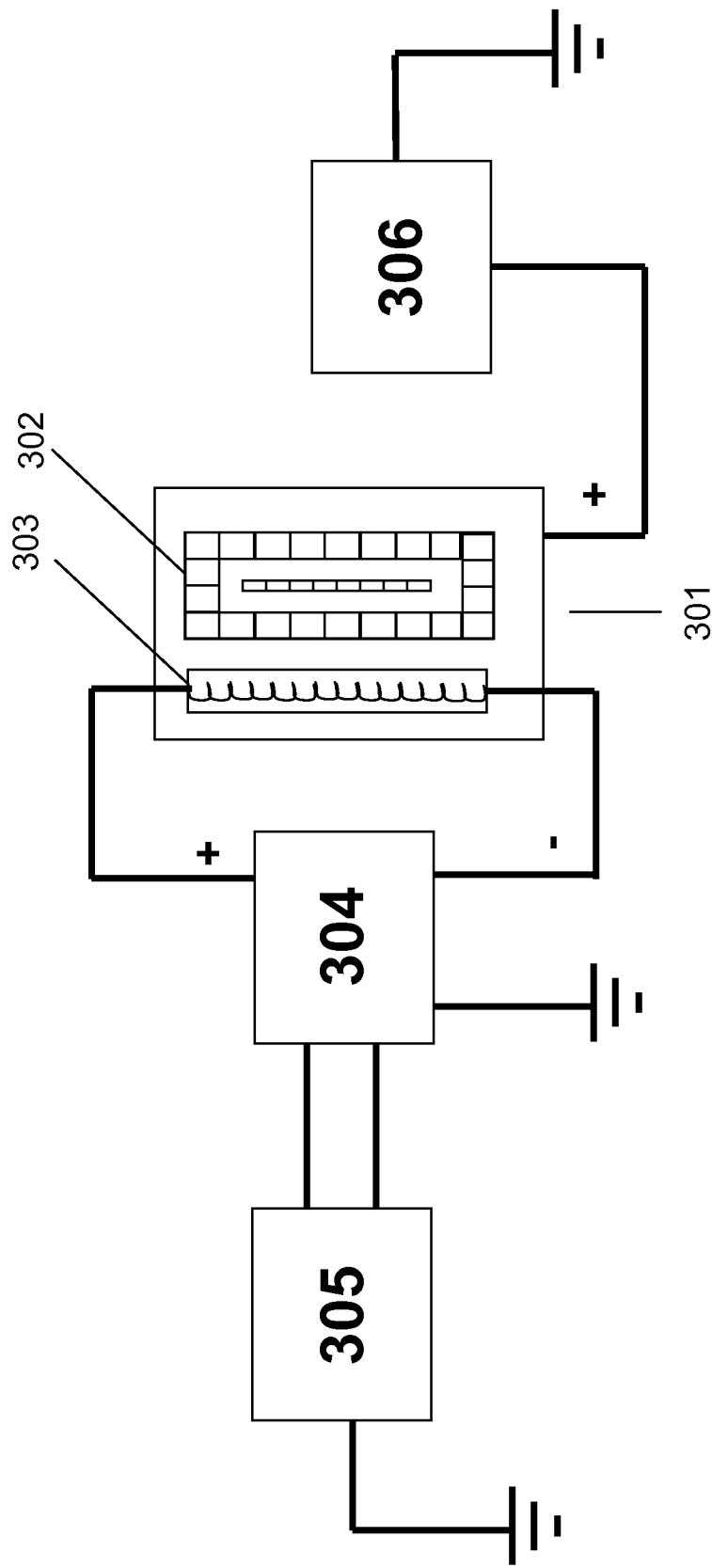
FIG. 3 is a schematic of a magnetron sputtering system with permanent magnets and sweeping electromagnets.

In the embodiment shown in FIG. 3, the inventors connected pulsed-DC power supply 306 operating at a frequency of 250 kHz with a 95% duty cycle, and connected to magnetron sputter deposition source 301 comprising a system of permanent magnets 302 and sweeping electromagnets 303. Unwanted inductive coupling between the electromagnets 303 and the pulsed-DC power supply 306 of the magnetron assembly was found to increase the rate of failure of the switching assembly 304 that controls the current that is applied to the sweeping electromagnets, and more specifically controls the polarity of the applied current in certain embodiments. In some embodiments, the switching assembly 304 comprises solid-state relays that are susceptible to failure under the influence of an induced AC voltage caused by inductive coupling from the high frequency pulsed DC power supply 306. The inventors have found that the failure rate of solid state relays inside the switching assembly 304 is dramatically improved by adding the circuit elements shown in FIG. 1.

Figure 1:
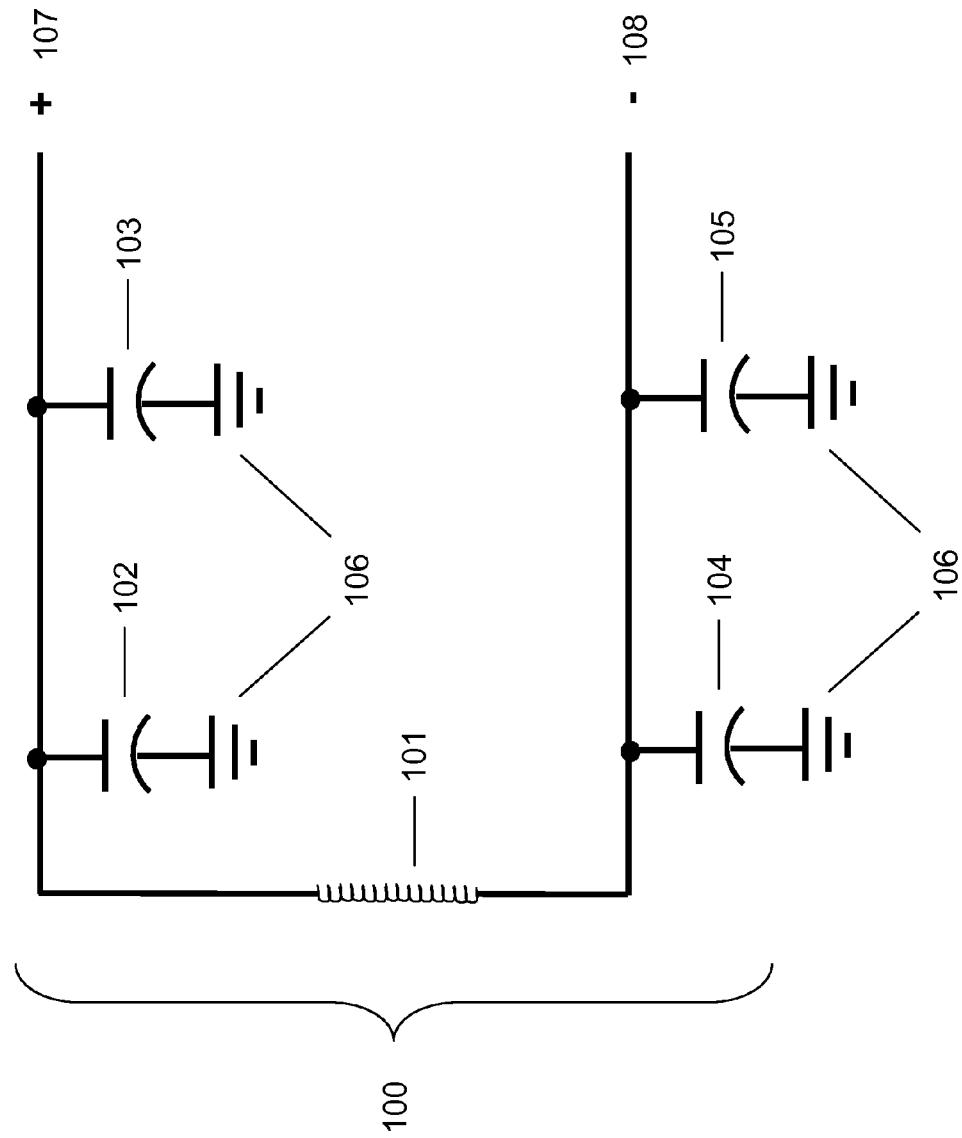
FIG. 1 is a circuit diagram of an electromagnetic coil and an RC filtering circuit.

In FIG. 1, capacitors 102 and 104 are 2 microfarads and resistors 103 and 105 are 1 kilo-ohms and are wired in parallel and connected to earth ground terminals 106 at each end of the electromagnetic coil 101. Electromagnetic coil 101 may be housed inside a magnetron sputter assembly in some embodiments, and used to adjust the magnetic field strength inside the assembly. By choosing sufficiently large capacitors, in this example 2 microfarad capacitors coupled with a pulsed-DC power supply operating at 250 kHz, the inductively coupled AC voltage created at terminals 107 and 108 of the pulsed-DC power supply was found to have impedance that was substantially reduced, in one embodiment down to an acceptable level of 0.3 ohms. The inventors understand that the capacitors may be sized as needed based on the operating frequency of the power supply to reduce output impedance to an acceptable level for a given magnetron sputtering assembly. Additionally, the capacitors should be selected such that the impedance is preferably less than about 100 ohms, more preferably less than about 10 ohms, and even more preferably less than about 1 ohm in certain embodiments.

Figure 2:
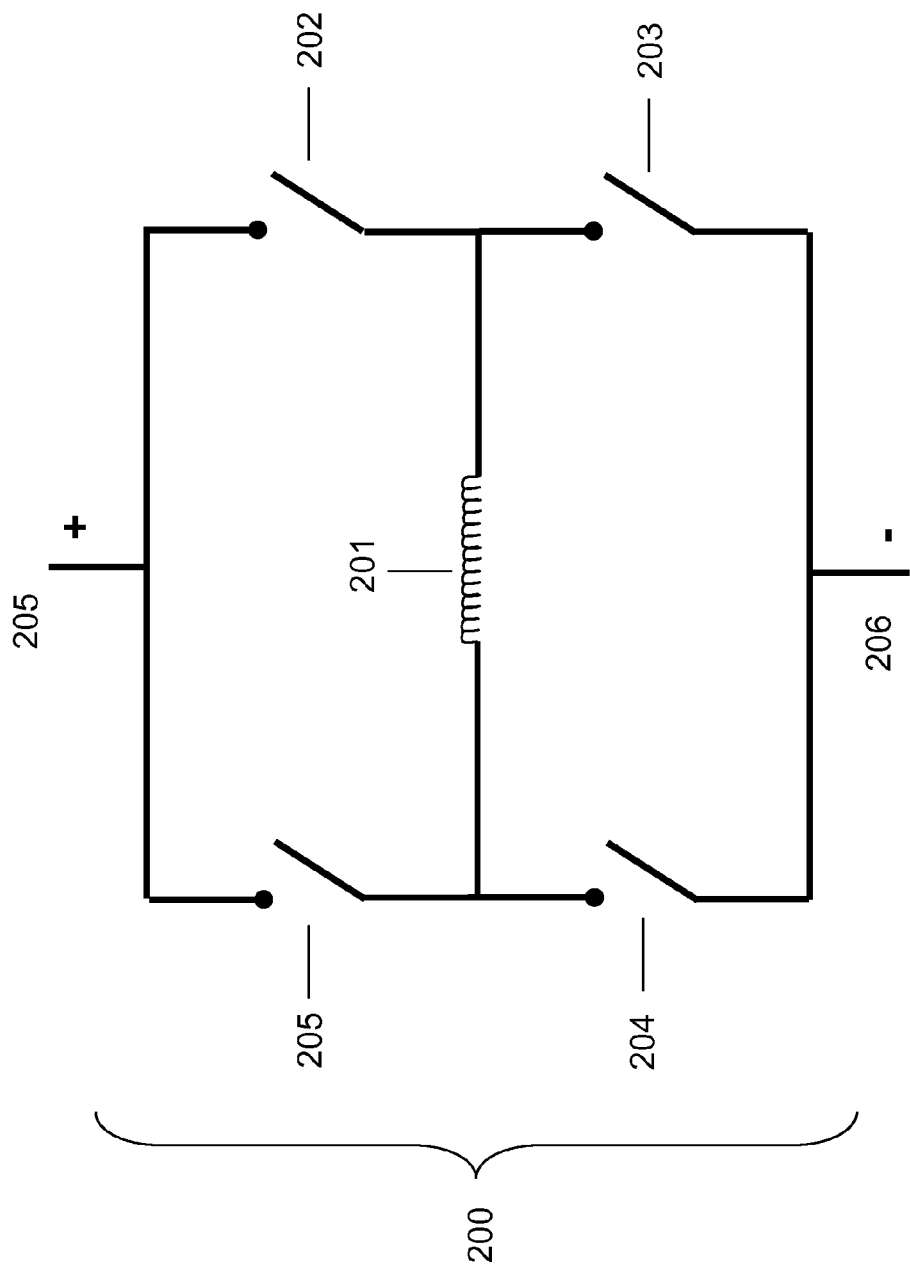
FIG. 2 is a circuit diagram of an H-bridge for controlling current flow through an electromagnetic coil.

An example of a switching assembly is shown in FIG. 2, which is a circuit diagram of an H-bridge used to control the direction of current flow to an electromagnetic coil assembly 201. Relays 202, 203, 204, and 205 may be solid-state relays or electromechanical relays. Alternatively, relays 202, 203, 204, and 205 may be electromechanical relays, and solid state relays (not shown) may be used only for controlling the position of the electromechanical relays, as would be known to one of skill in the art. When solid state relays are used in any configuration to control the current flow to electromagnetic coil assembly 201, the inventors have found a substantially increased rate of failure due to the inductive coupling of the high frequency pulsed magnetron power supply 306 with the separately powered sweeping electromagnet assemblies 303 shown in FIG. 3.

In other embodiments, multiple magnetron sputtering assemblies may be powered simultaneously in a single deposition chamber, or in adjacent vacuum deposition chambers. When multiple magnetron sputter assemblies are powered simultaneously in the same or in adjacent vacuum chambers, the inventors have found that an RC filter circuit as shown in FIG. 1 is particularly beneficial for isolating adjacent magnetron sputter deposition sources.

While specific embodiments of the present invention have been provided, it is to be understood that these embodiments are for illustration purposes and not limiting. Many additional embodiments will be apparent to persons of ordinary skill in the art reading this disclosure. Persons of ordinary skill in the art will further recognize that the invention can be practiced without one or more of the specific details or by using alternatives. For example, magnets shown as permanent magnets may be replaced by electromagnets (i.e., coils) and vice versa. In other instances, well known details are not shown or described to avoid obscuring aspects of the invention.

What is claimed is:

1. A magnetron sputtering system, comprising:
   a vacuum processing chamber having a chamber shield, and a magnetron assembly;
   the magnetron assembly comprising a permanent magnetic assembly and an electromagnetic coil assembly, the electromagnetic coil assembly having a first end and a second end;
   a first impedance circuit coupled between a ground terminal and the electromagnetic coil assembly at the first end of the electromagnetic coil assembly, the first impedance circuit comprising a first resistor and a first capacitor; and
   a second impedance circuit coupled between the ground terminal and the electromagnetic coil assembly at the second end of the electromagnetic coil assembly, the second impedance circuit having a second resistor separate from the first resistor and a second capacitor separate from the first capacitor.

2. The magnetron sputtering system of claim 1, wherein the magnetron assembly is electrically connected to a power supply comprising a pulsed-DC power supply.

3. The magnetron sputtering system of claim 2, wherein the pulsed-DC power supply operates at a frequency of between 20 kHz and 200 kHz.

4. The magnetron sputtering system of claim 2, wherein the pulsed-DC power supply has a duty cycle such that the magnetron assembly is powered on more than 70% of a time.

5. The magnetron sputtering system of claim 1, wherein the magnetron assembly is electrically connected to a power supply selected from an AC power supply, a pulsed-DC power supply, and an RF power supply.

6. The magnetron sputtering system of claim 5, wherein the power supply is an RF power supply operating at greater than 13 MHz.

7. The magnetron sputtering system of claim 1, wherein the first resistor and the first capacitor are wired in parallel.

8. The magnetron sputtering system of claim 7, wherein the second resistor and the second capacitor are wired in parallel.

9. The magnetron sputtering system of claim 8, wherein the first resistor has an electrical resistance of greater than 1 kilo-ohm.

10. The magnetron sputtering system of claim 8, wherein the first capacitor has a capacitance of greater than 2 microfarads.

11. The magnetron sputtering system of claim 8, wherein the second resistor has an electrical resistance of greater than 1 kilo-ohm.

12. The magnetron sputtering system of claim 8, wherein the second capacitor has a capacitance of greater than 2 microfarads.

13. The magnetron sputtering system of claim 11, wherein the first resistor has an electrical resistance of greater than 1 kilo-ohm.

14. The magnetron sputtering system of claim 8, wherein the first resistor and the first capacitor are selected to reduce a circuit impedance to an impedance between 0.01 and 1,000 ohms.

15. The magnetron sputtering system of claim 8, wherein the second resistor and the second capacitor are selected to reduce a circuit impedance to between 0.01 and 1,000 ohms.

16. A method of operating a magnetron sputtering system, comprising:
   providing a vacuum processing chamber having a chamber shield, and a magnetron assembly;
   wherein the magnetron assembly comprises a permanent magnetic assembly and an electromagnetic coil assembly, the electromagnetic coil assembly having a first end and a second end;
   providing a first impedance circuit coupled between a ground terminal and the electromagnetic coil assembly at the first end of the electromagnetic coil assembly, the first impedance circuit comprising a first resistor and a first capacitor;
   providing a second impedance circuit coupled between the ground terminal and the electromagnetic coil assembly at the second end of the electromagnetic coil assembly, the second impedance circuit having a second resistor separate from the first resistor and a second capacitor separate from the first capacitor; and operating the magnetron assembly such that a circuit impedance is less than 1,000 ohms.

17. The method of claim 16, wherein the magnetron assembly is electrically connected to a power supply comprising a pulsed-DC power supply.

18. The method of claim 17, wherein the pulsed-DC power supply operates at a frequency of between 20 kHz and 200 kHz.

19. The method of claim 17, wherein the pulsed-DC power supply has a duty cycle such that the magnetron assembly is powered on more than 70% of the time.

20. The method of claim 16, wherein the magnetron assembly is electrically connected to a power supply selected from an AC power supply, a pulsed-DC power supply, and an RF power supply.

21. The method of claim 20, wherein the power supply is an RF power supply operating at greater than 13 MHz.

22. The method of claim 17, wherein the first resistor and the first capacitor are wired in parallel.

23. The method of claim 17, wherein the second resistor and the second capacitor are wired in parallel.

24. The method of claim 23, wherein the first resistor and the second resistor have an electrical resistance of greater than 1 kilo-ohm.

25. The method of claim 23, wherein the first capacitor and the second capacitor have a capacitance of greater than 2 microfarads.

26. The method of claim 17, wherein operating the magnetron assembly such that the a circuit impedance is less than 1,000 ohms comprises reducing the circuit impedance to protect switching circuitry connected to the electromagnetic coil assembly by an induced AC voltage caused by inductive coupling of the electromagnetic coil assembly and the pulsed-DC power supply.

* * * * *